(12) United States Patent
Shields et al.

(10) Patent No.: US 7,071,101 B1
(45) Date of Patent: Jul. 4, 2006

(54) SACRIFICIAL TIN ARC LAYER FOR INCREASED PAD ETCH THROUGHPUT

(75) Inventors: Jeffrey A. Shields, Sunnyvale, CA (US); Kelwin Ko, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 612 days.

(21) Appl. No.: 09/208,325

(22) Filed: Dec. 9, 1998

(51) Int. Cl.
*H01L 21/4763* (2006.01)

(52) U.S. Cl. ............... 438/648; 438/637; 438/669; 438/672; 438/685

(58) Field of Classification Search ......... 438/648, 438/627–629, 636–640, 642–644, 656, 668–669, 438/672–675, 685
See application file for complete search history.

(56) References Cited

U.S. PATENT DOCUMENTS 5,741,626 A * 4/1998 Jain et al. ............... 430/314
5,880,026 A * 3/1999 Xing et al. ............... 438/688
5,882,999 A * 3/1999 Anderson et al. ......... 438/629
5,920,790 A * 7/1999 Wetzel et al. ............. 438/618

* cited by examiner

*Primary Examiner*—Thanh Nguyen

(57) ABSTRACT

A method of manufacturing a semiconductor device wherein a final layer of metal is formed on a layer of interlayer dielectric, forming a layer of TiN on the final layer of metal, forming a layer of photoresist on the layer of TiN, patterning and developing the layer of photoresist exposing portions of the final metal layer, and etching the exposed portions of the final metal layer forming metal structures. The layer of photoresist and layer of TiN are removed. A blanket layer of interlayer dielectric is formed on the surface of the semiconductor device. A second layer of photoresist is formed on the blanket layer of interlayer dielectric. The second layer of photoresist is patterned and developed exposing portions of the interlayer dielectric overlying the metal structures. The exposed portions of the interlayer dielectric are etched down to the surface of the metal structures.

3 Claims, 7 Drawing Sheets

US 7,071,101 B1

SACRIFICIAL TIN ARC LAYER FOR INCREASED PAD ETCH THROUGHPUT

BACKGROUND OF THE INVENTION

1. Field of the Invention

This invention relates generally to a method of manufacturing semiconductor devices and more specifically, this invention relates to a method of manufacturing semiconductor devices in which a layer of TiN formed on a surface of metal structures is removed after metal etch.

2. Discussion of the Related Art

In many of the current semiconductor manufacturing processes, the pad etch process consists of etching a layer of interlayer dielectric (ILD) and stopping on a layer of TiN on top of underlying metal structures. The layer of TiN is then etched completely down to the surface of the underlying metal structures. As is known in the semiconductor manufacturing art, pad etch is notoriously slow because of the substantial thickness of the final dielectric film and because of the requirement to completely remove the layer of TiN. The trend in the semiconductor manufacturing art is to make the layer of TiN sufficiently thick in order to prevent developer attack of the aluminum under TiN film, see the paper by E. G. Colgan, et al., "Formation Mechanism of Ring Defects during Metal RIE," 1994 VMIC Conference, Jun. 7–8, 1994, page 284–286. Because it is necessary to completely remove the layer of TiN during pad etch so it will not interfere with the gold wire bonding process, the increased thickness of the layer of TiN increases the time required for pad etch.

FIGS. 1A–1I show a prior art method of manufacturing a semiconductor device in which the layer of TiN formed on metal structures are etched during the pad etch process.

FIG. 1A shows a partially completed semiconductor device 100. The partially completed semiconductor device 100 includes a layer of material 102 that is typically a layer of an interlayer dielectric (ILD) formed from a material such as silicon dioxide. The layer 102 of interlayer dielectric is formed under the final metal layer 104. The layer 104 is a layer of metal that will be etched to form conductive interconnects from one portion of the semiconductor device 100 that will form pads that will be connected to external structures during the gold wire bonding process. The layer 104 is typically formed from aluminum. A layer 106 of TiN is formed on the surface of the layer 104. The layer 106 of TIN serves as both a barrier layer and as an anti-reflective coating. A layer 108 of photoresist is formed on the surface of the layer 106 of TiN.

FIG. 1B shows the partially completed semiconductor device 100 as shown in FIG. 1A with the layer of photoresist 108 patterned and developed forming holes 110 and 112 in the layer 108 of photoresist that expose portions of the layer 106 of TiN.

FIG. 1C shows the partially completed semiconductor device 100 as shown in FIG. 1B after an etch process to etch the exposed portions of the layer 106 of TiN and exposing portions of the metal layer 104.

FIG. 1D shows the partially completed semiconductor device 100 as shown in FIG. 1C after an etch process to etch the exposed portions of the metal layer 104 down to the surface of the layer 102 of interlayer dielectric.

FIG. 1E shows the partially completed semiconductor device 100 as shown in FIG. 1D with the layer of photoresist 108 removed.

FIG. 1F shows the partially completed semiconductor device 100 as shown in FIG. 1E with a blanket layer 114 of interlayer dielectric formed on the surface of the semiconductor device 100 and filling the holes 110 and 112.

FIG. 1G shows the partially completed semiconductor device 100 as shown in FIG. 1F after a layer 116 of photoresist is formed on the surface of the layer 114 of interlayer dielectric. The layer 116 of photoresist is patterned and developed to form holes 118, 120, and 122 that expose portions of the layer 114 of interlayer dielectric.

FIG. 1H shows the partially completed semiconductor device 100 as shown in FIG. 1G after an etch process to etch exposed portions of the layer 114 of interlayer dielectric exposing portions of the layer 106 of TiN.

FIG. 1I shows the partially completed semiconductor device 100 as shown in FIG. 1H after an etch process to etch the exposed portions of the layer 106 of TiN.

The step of completely etching the layer 106 of TiN during the pad etch process causes a slow down in the throughput of the semiconductor device during the manufacturing process.

Therefore, what is needed is a manufacturing process that does not require the step of etching the TiN layer during pad etch.

SUMMARY OF THE INVENTION

According to the present invention, the foregoing and other objects and advantages are obtained by a method of manufacturing semiconductor devices wherein a layer of TiN overlying metal structures in the final metal layer is removed after final metal etch. In accordance with one aspect of the invention, the method involves forming a final layer of metal on a layer of interlayer dielectric, forming a layer of TiN on the final layer of metal, forming a layer of photoresist on the layer of TiN, patterning and developing the layer of photoresist exposing portions of the final metal layer, and etching the exposed portions of the final metal layer forming metal structures. The layer of photoresist and layer of TiN are removed.

In another aspect of the invention, a blanket layer of interlayer dielectric is formed on the surface of the semiconductor device after the layer of photoresist and layer of TiN are removed. A second layer of photoresist is patterned and developed exposing portions of the interlayer dielectric overlying the metal structures. The exposed portions of the interlayer dielectric are etched down to the surface of the metal structures.

In still another aspect of the invention, the layer of photoresist and the layer TiN are removed by a process utilizing fluorine containing gas chemistry at an elevated temperature.

The described method of manufacturing semiconductor devices thus provides a method of removing the layer of TiN formed on the final metal layer structures resulting in improved throughput during pad etch.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention.

Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

FIGS. 1A–1I show a prior art method of manufacturing a semiconductor device in which a layer of TiN formed on a metal structure is etched during the pad etch process, wherein;

FIG. 1A shows a partially completed semiconductor device showing the final metal layer with a layer of TiN formed on the metal layer and a layer of photoresist formed on the layer of TiN;

FIG. 1B shows the partially completed semiconductor device as shown in FIG. 1A with the layer of photoresist patterned and developed forming holes in the photoresist exposing portions of the layer of TiN;

FIG. 1C shows the partially completed semiconductor device as shown in FIG. 1B after an etch process etches the exposed portions of the layer of TiN exposing portions of the metal layer;

FIG. 1D shows the partially completed semiconductor device as shown in FIG. 1C after an etch process etches the exposed portions of the metal layer exposing portions of a layer of interlayer dielectric underlying the metal layer;

FIG. 1E shows the partially completed semiconductor device as shown in FIG. 1D with the layer of photoresist removed;

FIG. 1F shows the partially completed semiconductor device as shown in FIG. 1E with a blanket layer of interlayer dielectric formed on the surface of the semiconductor device;

FIG. 1G shows the partially completed semiconductor device as shown in FIG. 1F after a layer of photoresist has been formed on the surface of the layer of interlayer dielectric and after the layer of photoresist has been patterned and developed exposing selected portions of the layer of interlayer dielectric;

FIG. 1H shows the partially completed semiconductor device as shown in FIG. 1G after an etch process to etch the exposed portions of the layer of interlayer dielectric down to the layer of TiN;

FIG. 1I shows the partially completed semiconductor device as shown in FIG. 1H after an etch process to etch the exposed layer of TiN;

FIGS. 2A–2F show a method of manufacturing a semiconductor device in accordance with the present invention; wherein;

FIG. 2A shows the partially completed semiconductor device as shown in FIG. 1D after the layer of photoresist has been removed;

FIG. 2B shows the partially completed semiconductor device as shown in FIG. 2A after the layer of TiN has been removed from the surfaces of metal structures formed in previous processing steps;

FIG. 2C shows the partially completed semiconductor device as shown in FIG. 2B with a blanket layer of interlayer dielectric formed on the surface of the semiconductor device;

FIG. 2D shows the partially completed semiconductor device as shown in FIG. 2C after a layer of photoresist has been formed on the surface of the layer of interlayer dielectric and after the layer of photoresist has been patterned and developed exposing selected portions of the layer of interlayer dielectric;

FIG. 2E shows the partially completed semiconductor device as shown in FIG. 2D after an etch process to etch the exposing portions of the layer of interlayer dielectric; and FIG. 2F shows the partially completed semiconductor device as shown in FIG. 2E after the layer of photoresist has been removed.

DETAILED DESCRIPTION

Reference is now made in detail to specific embodiments of the present invention which illustrate the best mode presently contemplated by the inventors for practicing the invention.

FIGS. 2A–2F show a method manufacturing a semiconductor device in accordance with the present invention.

Figure 1A:
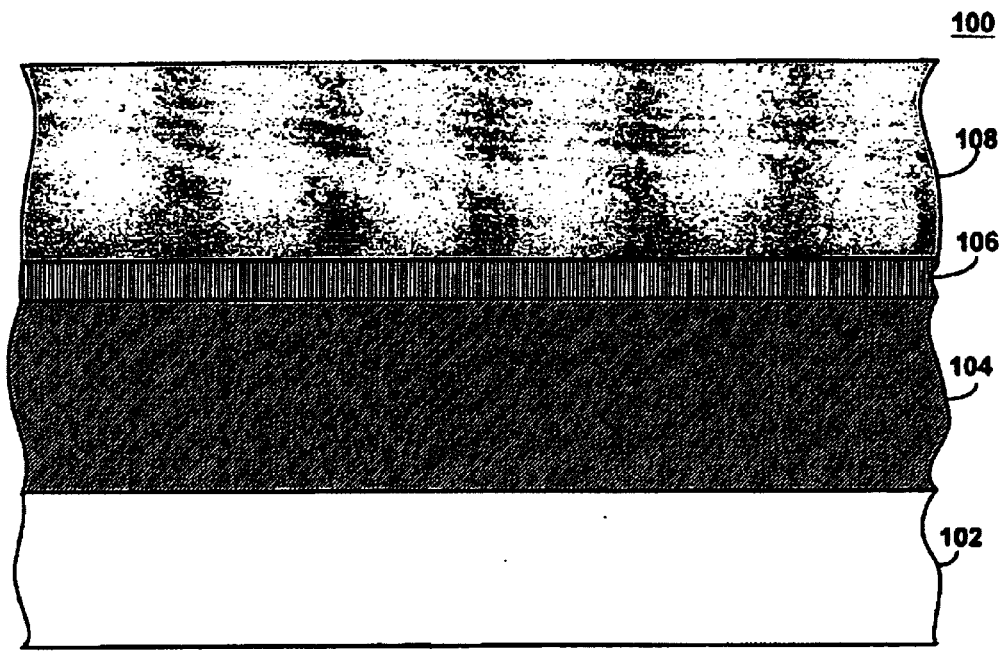
Figure 1B:
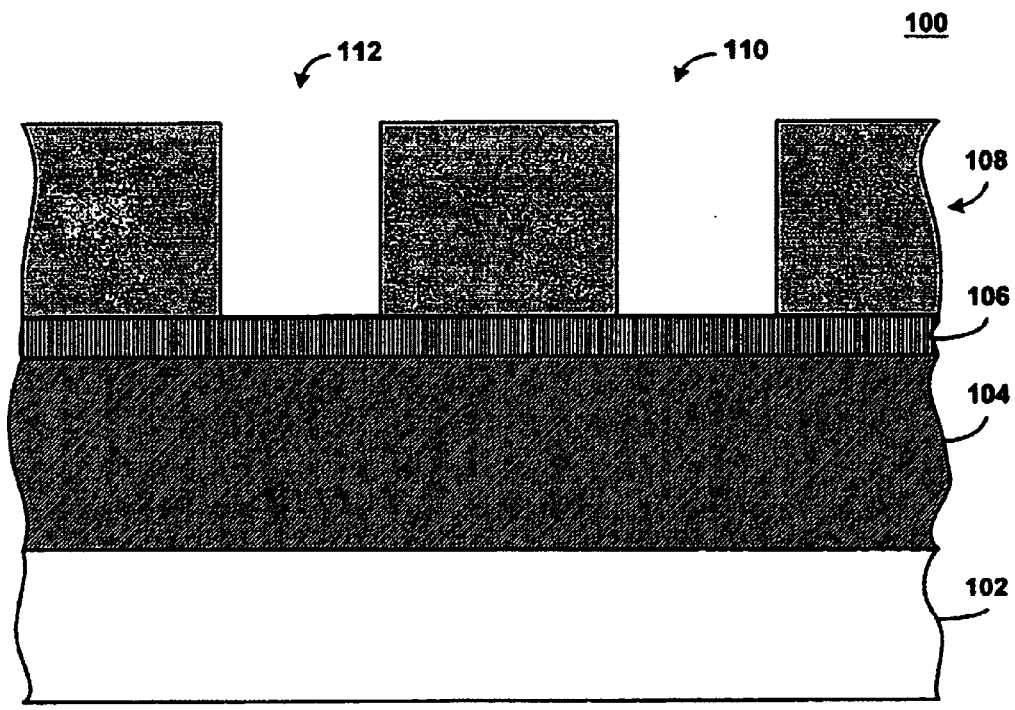
Figure 1C:
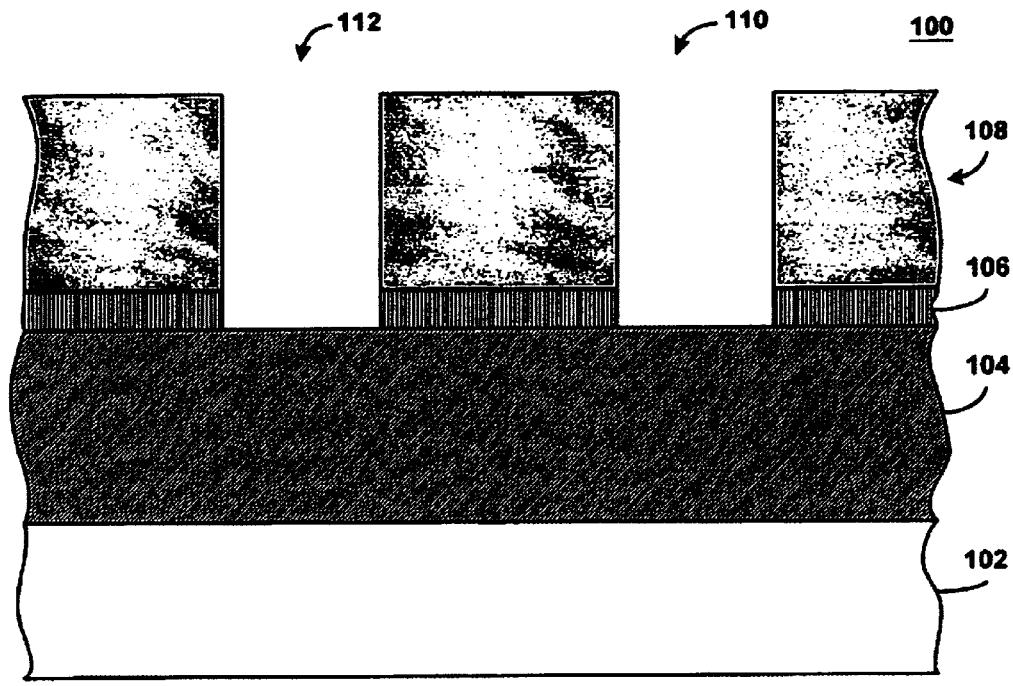
Figure 1D:
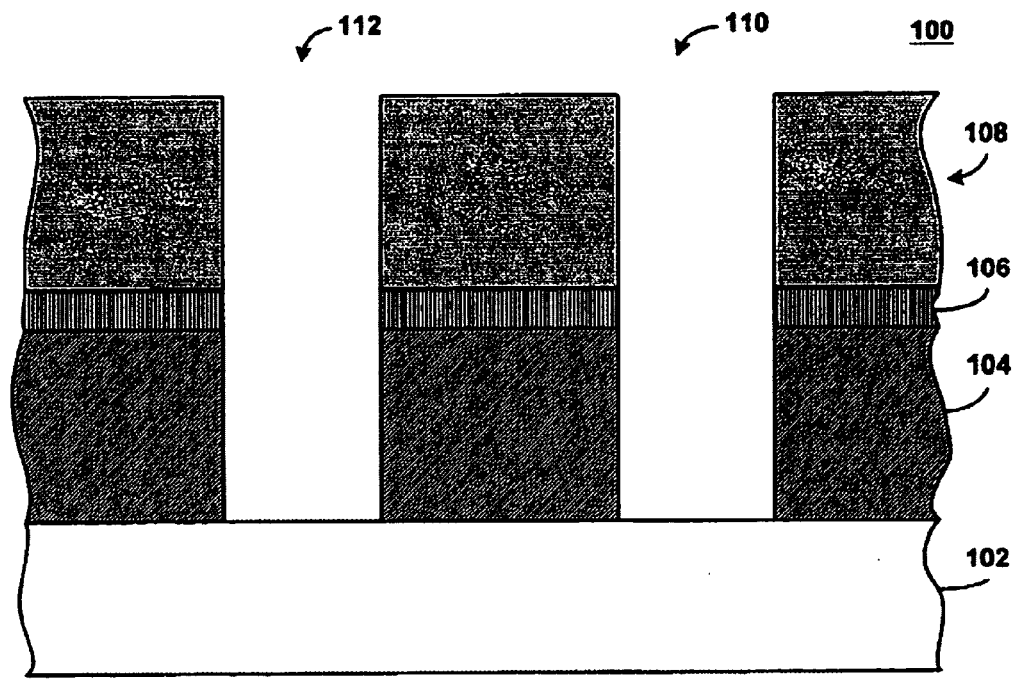
Figure 1E:
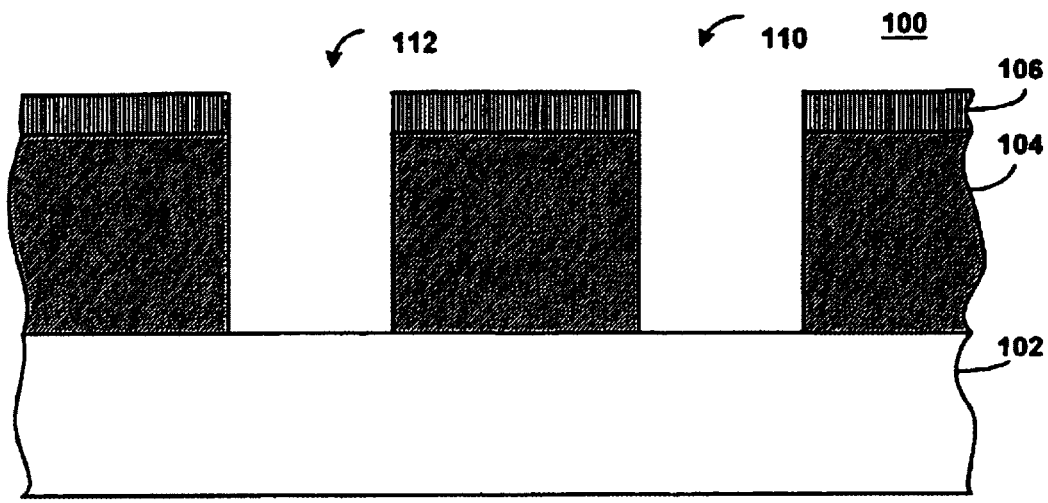
Figure 1F:
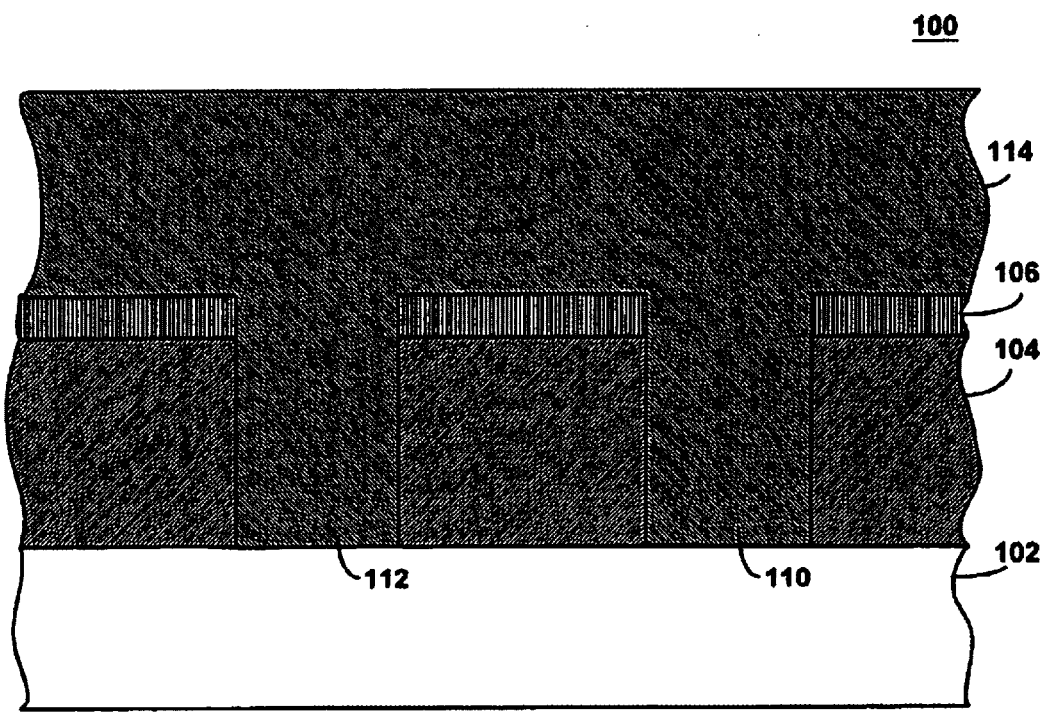
Figure 1G:
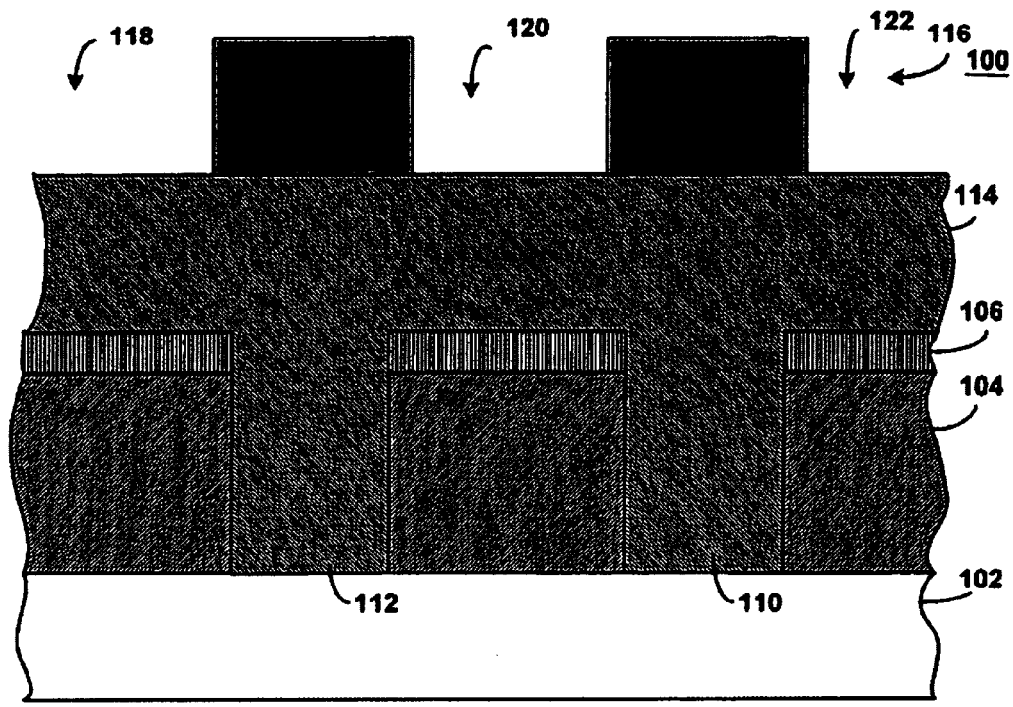
Figure 1H:
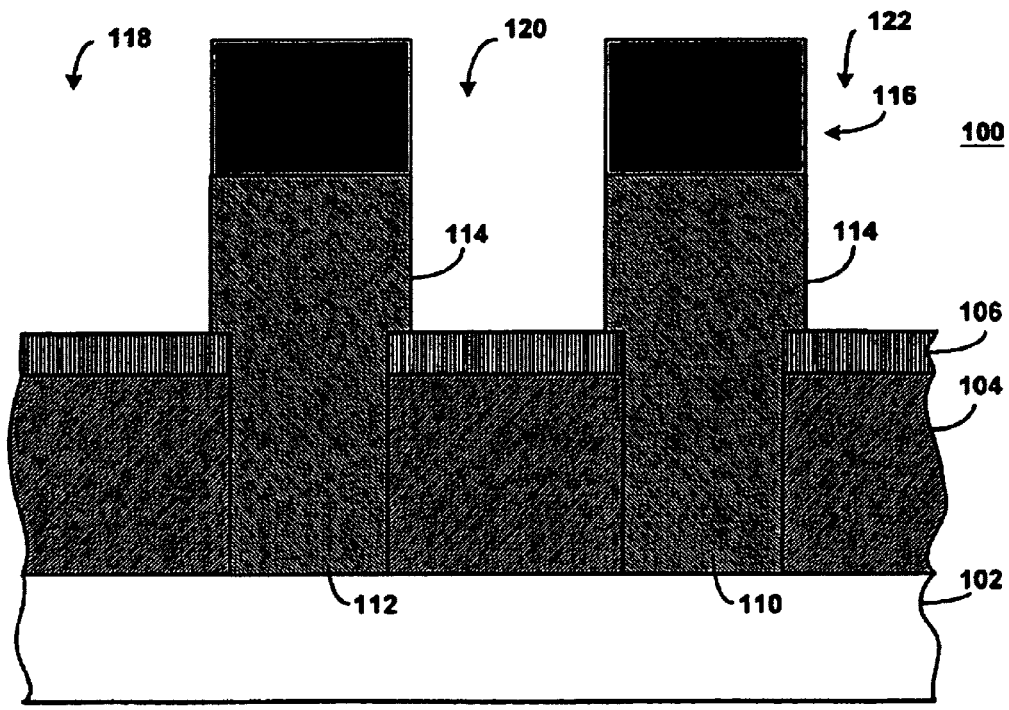
Figure 1I:
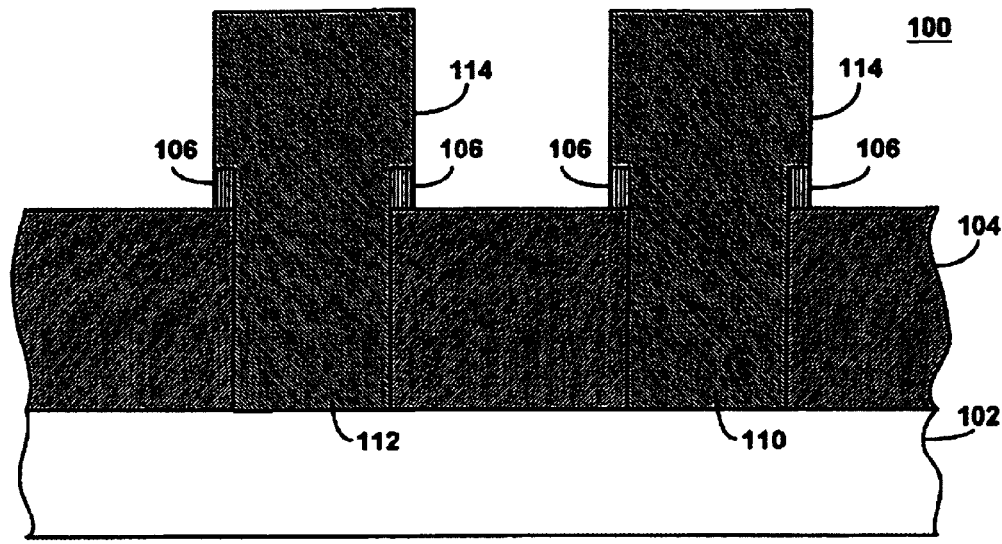
Figure 2A:
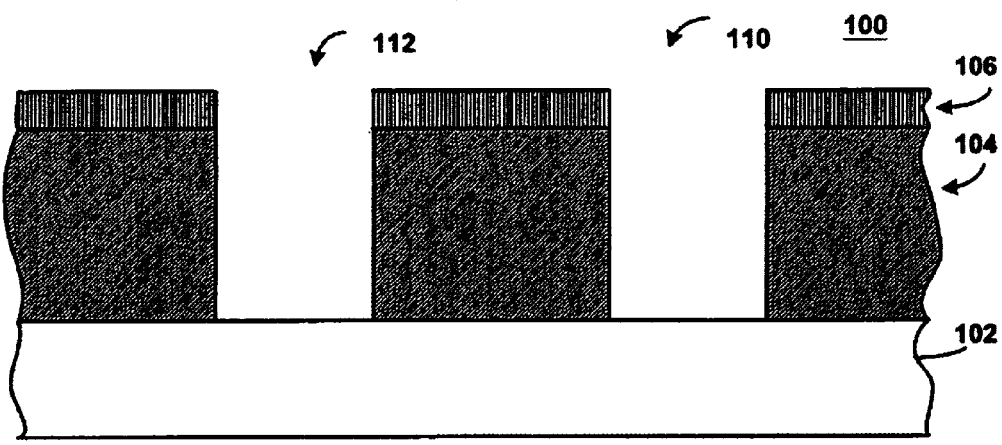

FIG. 2A shows the partially completed semiconductor device 100 as shown in FIG. 1D with the layer 108 of photoresist removed.

Figure 2B:
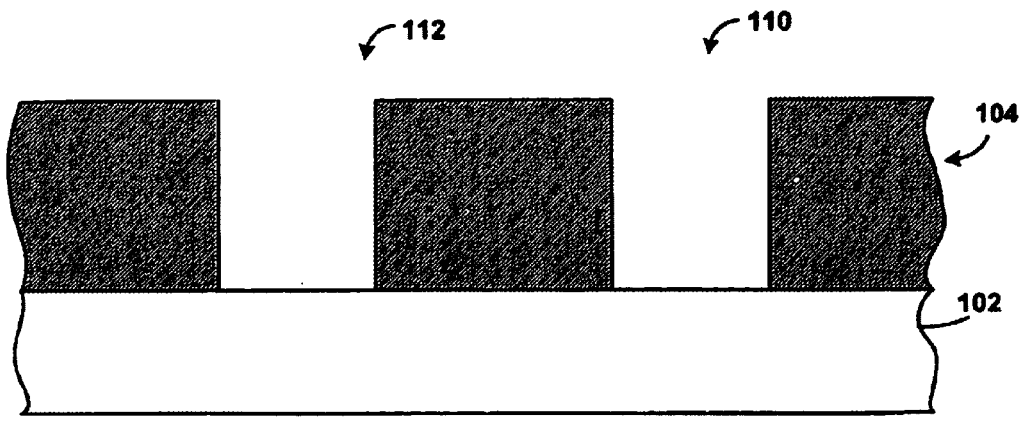

FIG. 2B shows the partially completed semiconductor device 100 as shown in FIG. 2A with the layer 106 of TiN removed. The layer 108 of photoresist and the layer 106 of TiN are stripped during the same process step. One such method is to use a fluorine containing gas chemistry at elevated temperatures. For example, it has been shown that TiN and the resist can be removed effectively using a $CF_4/O_2$ gas chemistry at elevated temperatures. Typical applied power is in a range of 500 to 1000 W at a pressure in a range of 500 to 2000 mTorr. Typical gas flow rates are in the range of 100 to 500 sccm. The TiN removal rate is strongly dependent on the wafer temperature and $CF_4$ gas flow, with higher removal rates at higher temperature and higher flow rates. TiN removal rates in excess of 2000 Å/minute were achieved at 120° C. wafer temperature, with substantially higher removal rates as temperatures were increased up to 240° C. This has been demonstrated in both an inductively-coupled resist stripper and a downstream microwave resist stripper.

Figure 2C:
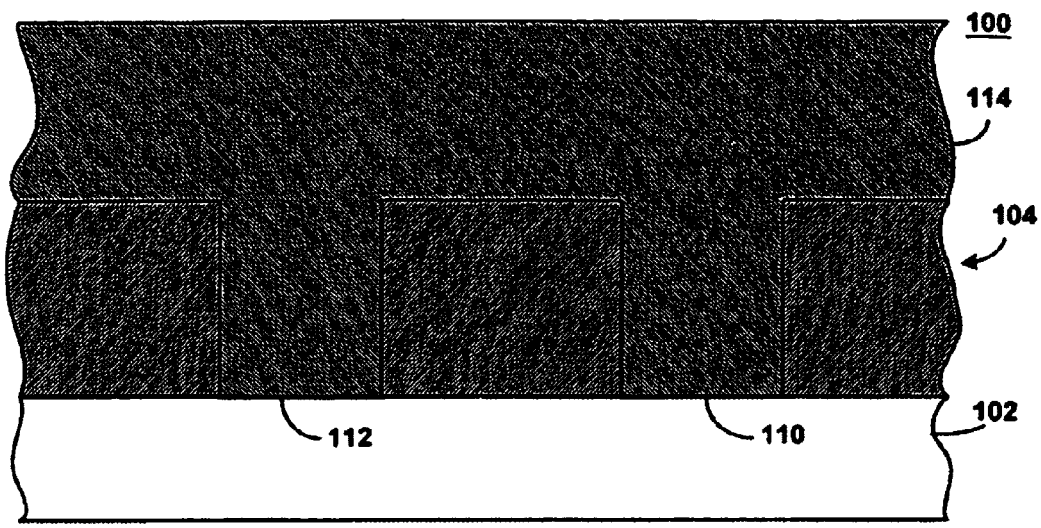

FIG. 2C shows the partially completed semiconductor device 100 as shown in FIG. 2B with a blanket layer 114 of interlayer dielectric formed on the surface of the semiconductor device 100 and filling the holes 110 and 112.

Figure 2D:
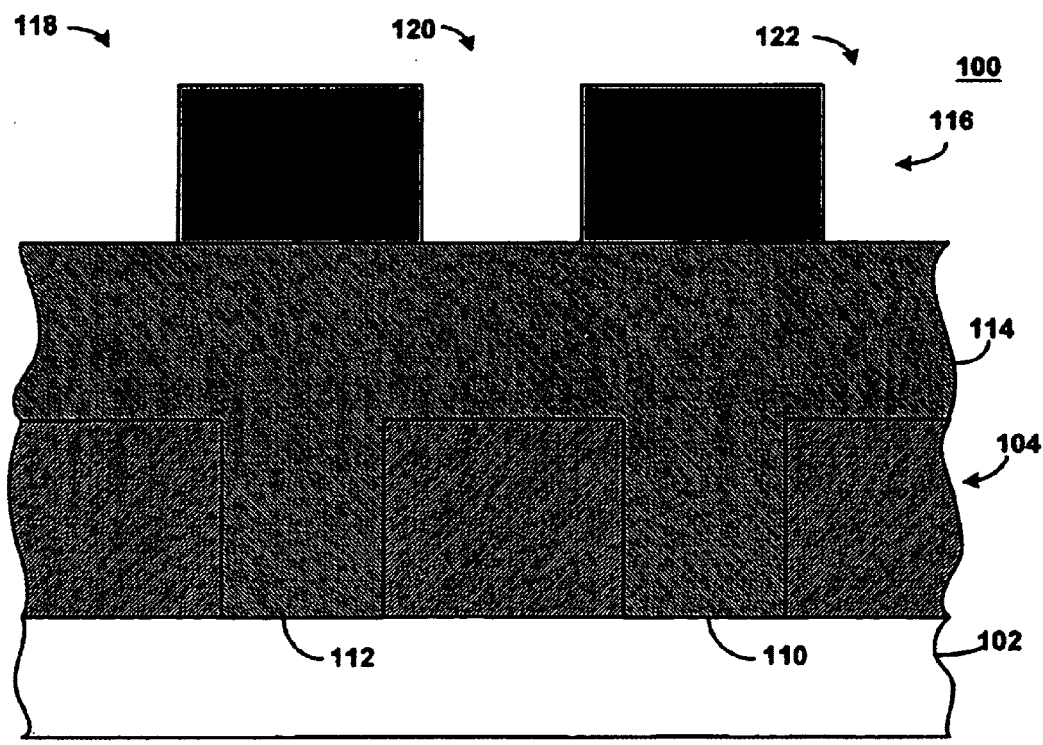

FIG. 2D shows the partially completed semiconductor device 100 as shown in FIG. 2C after a layer 116 of photoresist is formed on the surface of the layer 114 of interlayer dielectric. The layer 116 of photoresist is patterned and developed to form holes 118, 120, and 122 that expose portions of the layer 114 of interlayer dielectric.

Figure 2E:
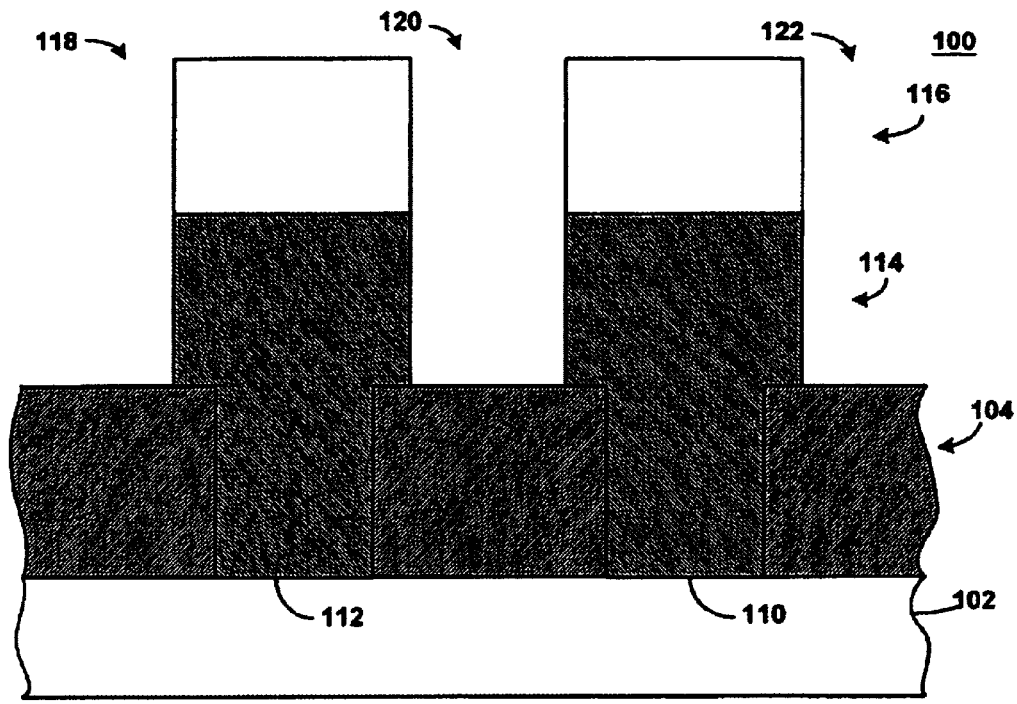

FIG. 2E shows the partially completed semiconductor device 100 as shown in FIG. 2C after an etch process to etch exposed portions of the layer 114 exposing portions of the layer 104.

Figure 2F:
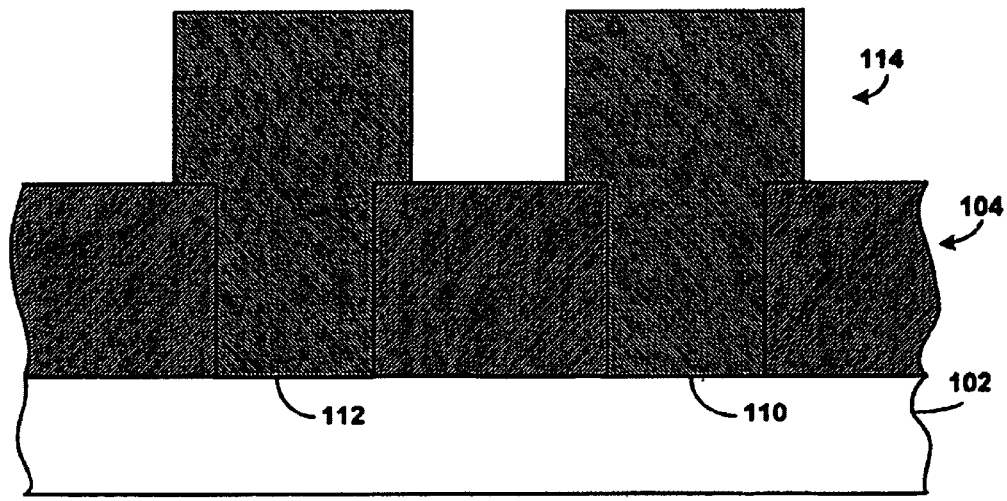

FIG. 2F shows the partially completed semiconductor device 100 as shown in FIG. 2E with the layer 116 of photoresist removed.

In summary, the results and advantages of the method of the present invention can now be fully realized. The method of removing the layer of TiN after final metal etch thus provides increased throughput during pad etch.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device, wherein the method comprises:

forming a final layer of metal on a layer of interlayer dielectric in the semiconductor device;

forming a layer of TiN on the final layer of metal;

forming a first layer of photoresist on the layer of TiN;

patterning and developing the first layer of photoresist exposing portions of the layer of TiN;

etching holes in the layer of TiN the final layer of metal exposing portions of the interlayer dielectric, wherein metal structures are formed;

removing the first layer of photoresist;

removing remaining portions of the layer of TiN; and forming a blanket layer of interlayer dielectric on the surface of the semiconductor device;

forming as second layer of photoresist on the blanket layer of interlayer dielectric;

patterning and developing the second layer of photoresist exposing portions of the blanket layer of interlayer dielectric overlying metal structures; and etching the exposed portions of the blanket layer of interlayer dielectric overlying metal structures; and etching the exposed portions of the blanket layer of interlayer dielectric down to the metal structures.

2. The method of claim 1 further comprising removing the second layer of photoresist.

3. The method of claim 1 wherein the first layer of photoresist and the layer of TiN is etched by a process utilizing fluorine containing gas chemistry at an elevated temperature.

* * * * *